(12) United States Patent
Tanaka

(10) Patent No.: US 6,332,322 B1
(45) Date of Patent: Dec. 25, 2001

(54) ELECTRONIC DEVICE HAVING A THERMALLY ISOLATED ELEMENT

(75) Inventor: Akio Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/558,597

(22) Filed: Apr. 26, 2000

(30) Foreign Application Priority Data

Apr. 27, 1999 (JP) .................................................. 11-119270

(51) Int. Cl.[7] .................................................... F25B 21/02
(52) U.S. Cl. ............................. 62/3.7; 62/3.3; 62/259.2
(58) Field of Search ...................... 62/3.7, 259.2, 62/3.3

(56) References Cited

U.S. PATENT DOCUMENTS

| | | | | |
|---|---|---|---|---|
| 4,402,185 | * | 9/1983 | Perchak | 62/3 |
| 4,989,626 | * | 2/1991 | Takagi et al. | 137/13 |
| 5,362,983 | * | 11/1994 | Yamamura et al. | 257/414 |
| 5,386,313 | * | 1/1995 | Sezegedi et al. | 359/280 |
| 5,419,780 | * | 5/1995 | Suski | 136/205 |
| 5,576,512 | * | 11/1996 | Doke | 136/203 |
| 5,802,855 | * | 9/1998 | Yamaguchi et al. | 62/3.2 |
| 5,996,353 | * | 12/1999 | Maxwell et al. | 62/3.2 |
| 6,055,815 | * | 5/2000 | Peterson | 62/3.7 |
| 6,112,525 | * | 9/2000 | Yoshida et al. | 62/3.7 |
| 6,112,531 | * | 9/2000 | Yamaguchi | 62/51.1 |

FOREIGN PATENT DOCUMENTS

| | | |
|---|---|---|
| 64-17456 | 1/1989 | (JP) . |
| 6-85122 | 3/1994 | (JP) . |

OTHER PUBLICATIONS

Y. Inuishi et al., "Properties of Semiconductors", pp. 223.

* cited by examiner

*Primary Examiner*—William Doerrler
*Assistant Examiner*—Mark S. Shulman
(74) *Attorney, Agent, or Firm*—Sughrue Mion, PLLC

(57) ABSTRACT

An electronic device includes a thermally isolated element formed above a substrate such that the thermally isolated element is isolated from the substrate by a cavity, a thermal-to-electrical transducer for converting heat to an electrical signal, an electrical-to-thermal transducer for converting an electrical signal to heat, a functional material whose physical property changes at a particular temperature, and a circuit, formed on the substrate, for controlling the electrical-to-thermal transducer in accordance with a signal received from the thermal-to-electrical transducer. The thermal-to-electrical transducer, the electrical-to-thermal transducer, and the functional material are formed in the thermally isolated element.

24 Claims, 10 Drawing Sheets

ELECTRONIC DEVICE HAVING A THERMALLY ISOLATED ELEMENT

BACKGROUND OF THE INVENTION

The present invention relates to an electronic device using a functional device whose function is achieved at a particular temperature or whose performance is enhanced at a particular temperature and also using a thermally isolated element including an electrical-to-thermal transducer.

Functional devices, such as, a semiconductor device and an electronic device are generally used at room temperature without performing particular temperature control.

Of course, when functional devices generate large heat, cooling means, such as, a cooling fan, a water cooling pipe or a heat pipe is used to prevent overheating.

However, even in this case, the purpose of the cooling means is to be operable near room temperature. That is, the common sense in the art is that functional devices are operated at a temperature near room temperature.

To this end, a superconducting device, such as, a Josephson device, has been used for application, such as, observation of stars in which low noise performance is particularly required. However, the superconducting device is not widely used because it does not operate at room temperature.

It is well known that semiconductor devices generally exhibit their highest performance not at room temperature but at lower temperatures. More specifically, semiconductors generally have greater electron mobilities at low temperatures, and thus semiconductor devices can operate at higher speeds at low temperatures.

In optical devices, such as, a light emitting device and a semiconductor laser, the luminous efficiency can be increased to a great extent by reducing the operating temperature.

The above-described enhancement of performance at low temperatures results from a reduction in phonon scattering. In most semiconductor devices, as described above, their potential is not fully exploited.

Most of functional devices are used at a temperature near room temperature, as described above. However, the room temperature varies depending on locations and environments. Room temperature in some area is extremely low but extremely high in another area.

In extremely low-temperature areas, the outside air temperature becomes lower than −50° C. On the other hand, the temperature can be higher than 80° C. in a parked car or on a telephone pole in summer. As described above, room temperature, at which functional devices are operated, varies within such a wide range.

In other words, in order to fully use the potential of functional devices or to assure the operation of functional devices, it is required that functional devices be operated in a thermal environment which is controlled within a proper range.

For example, superconducting devices essentially need a refrigerant, such as, liquid helium or liquid nitrogen or a cooling device. In order to fully use the potential of semiconductor devices, it is also required to cool them.

Furthermore, in order to operate functional devices at room temperature in a wide range of ambient temperature, thermal isolation, ventilation, and/or other mechanisms are required. In a conventional technique disclosed in Japanese Unexamined Patent Publication No. Sho. 64-17456, a semiconductor device or a transmission circuit is disposed on a cooling electrode of a Peltier device thereby controlling the temperature of the semiconductor device or the transmission circuit.

In another technique disclosed in Japanese Unexamined Patent Publication No. Hei.6-085122, a Peltier device for cooling a functional device is disposed on a radiation base plate, and the functional device is enclosed together with the cooling Peltier device in a package.

Furthermore, another Peltier device is disposed on the outer side of the radiation base plate thereby controlling the temperature of the radiation base plate. The temperature of the functional device is maintained within a desirable range by controlling the temperature of the radiation base plate at a proper value regardless of the variation in the ambient temperature.

In FIG. 1, a scanning circuit 1502 is formed on a semiconductor substrate 1501. Further, it a thermal-to-electrical transducer (or a converting device) 1506 is formed over the scanning circuit 1502 via a cavity 1504. A diaphragm 1503 is placed on the thermal-to-electrical transducer. Moreover, an infrared ray absorption layer 1505 is formed on the diaphragm 1503.

A first problem to be solved by the present invention is that when a functional device, having a peculiar physical property which appears at a particular temperature, is used, a temperature control device, such as, a cooler or a heater occupies a much greater space than the functional device itself. Furthermore, electric power consumed by the cooling device is much greater than electric power consumed by the functional device. This is a serious problem encountered when a superconducting device is used.

In high-speed signal processors, copper interconnection wires are used to reduce the resistance of interconnection wires thereby reducing the propagation delay due to parasitic CR (capacitance and resistance) associated with interconnection wires. If superconducting interconnection wires having no resistance are used, a processor capable of operating at an ultra-high speed can be realized.

In microwave devices, on the other hand, a superconducting SIS detector and/or a superconducting interconnection allow extremely low noise detection of a microwave. However, in any case, the problems are the large size and large power consumption of the temperature control device.

Similar problems also occur in devices, other the superconducting devices, which are used at a cooled temperature. More specifically, a quantum infrared sensor formed of mercury cadmium tellurium or platinum suicide is cooled using a stirring cycle cooler or a Peltier device.

However, even the most advanced small-sized low-power stirring cycle cooler has a volume as large as several hundred cm³ and a weight as heavy as 1 kg and needs electric power as high as 10 W. This example of the cooler is used when a device having a size of a few mm square is cooled at about 77K. When the device has a greater size and/or when it is required to cool the device at a lower temperature, the volume, the weight, and the power consumption of the cooler become greater.

Although the coolers using a Peltier device, disclosed in Japanese Unexamined Patent Application Publication Nos. 6-085122 and 64-17456 cited above, are smaller in volume and weight than stirring cycle coolers, there is no significant difference in power consumption.

In quantum infrared sensors and compound semiconductor devices, the electron mobility increases and noise decreases with decreasing temperature. Therefore, if such a device is operated at a low temperature, it is possible to achieve extremely low noise performance in a microwave range. However, the above-described problem also occurs in this case.

On the other hand, the dielectric constants and pyroelectric coefficients (temperature dependence of spontaneous polarization) of ferroelectric materials increase to very large levels at temperatures near their Curie temperatures.

If a ferroelectric material is used at a temperature near its Curie temperature to obtain a high dielectric constant, it is possible to realize a high-capacity memory with a small cell size.

The large pyroelectric coefficient of a ferroelectric material allows an improvement in sensitivity of a pyroelectric infrared sensor. However, also in these cases, the problems are the large size and large power consumption of devices. If a conventional temperature control device is used to cool a plurality of functional materials at different temperatures, the size of the temperature control device becomes still greater.

Even when a cooler using Peltier devices is employed, it is required to dispose as many Peltier devices each having a size of a few cm square as the number of temperature levels at which functional devices are cooled.

A second problem to be solved by the present invention is that it takes a long time for the conventional temperature control device to reach a desired temperature. Even in the case of a Peltier device which can reach a desired temperature in a rather short time, a period of time of the order of several sec to several ten sec is needed to reach a desired temperature.

The time needed before reaching a desired temperature depends on the thermal time constant of the device to be cooled and that of the Peltier device itself and also depends on the cooling ability of the Peltier device.

The thermal time constant is given by the product of the heat capacity of the device or the Peltier device and the thermal resistance between the device or the Peltier device and the outside. The thermal resistance is generally set to a rather large value so that the device can be cooled with low electric power. However, this causes an increase in the thermal time constant given by the product of the large thermal resistance and the heat capacity of the device or the Peltier device.

The large thermal time constant results in a problem that it takes a long time for a device to become operable after turning on the power to the device, and also results in a problem that a long waiting time is required to change the temperature.

A third problem to be solved by the present invention is low accuracy in controlling the temperature using the conventional temperature control device. This problem is particularly serious in temperature control devices using compression and expansion of gas, such as, a stirring cooler. Even if a conventional cooler using a Peltier device is employed, it is not easy to accurately control the temperature.

This is because the signal output from the temperature sensor responsible for monitoring the temperature is very small in magnitude and thus the signal tends to be affected by noise and also because a large current flowing through the Peltier device tends to generate noise.

SUMMARY OF THE INVENTION

According to an aspect of the present invention, there is provided an electronic device characterized in that at least a part of a functional device, which is operated at a desired temperature, is in thermal contact with a thermally isolated element having a capability of converting an electrical signal to heat.

Herein, examples of the functional device include a device whose function is achieved when the device is cooled (such as a superconducting device), a device whose performance is enhanced when the device is cooled (such as a semiconductor laser and a semiconductor integrated circuit), a device whose performance is enhanced when the device is heated (such as a device formed of a ferroelectric material), and a device whose function is achieved by quickly changing the temperature thereof (such as a variable wavelength laser).

The thermally isolated element refers to a structure having a device part isolated from a substrate by a cavity (an example of the thermally isolated element is a diaphragm). In "Description of the Preferred Embodiment" described later, a thermally isolated element in the form of a diaphragm will be employed by way of example. It is desirable that the thickness of the device part of the thermally isolated element be equal to or less than $10 \mu m$ so that the device part is uniformly controlled at a desired temperature. The diaphragm having such a thickness may be produced using a conventional silicon process.

Furthermore, the thermally isolated element preferably includes a leg for supporting the device part wherein the leg also serves to electrically connect the device part to the substrate. Preferably, a circuit is formed in the substrate in an integrated fashion with a high integration density.

The electronic device may include a plurality of thermally isolated elements and the respective thermally isolated elements may be separately controlled at arbitrary temperatures. This makes it possible to realize a semiconductor device including a plurality of different types of devices.

The capability of converting an electrical signal to heat may be realized, for example, by a thin film-shaped Peltier device. The thin film-shaped Peltier device is preferably formed of a material whose major constituent is silicon. This type of Peltier device is advantageous in that it can be produced into a very small form using a silicon production process.

More preferably, the thermally isolated element further includes means for converting heat to an electrical signal thereby making it possible to control the means for converting an electric signal to heat. According to the present invention, the electronic device may be formed in the above-described manner into an extremely small size so that the electronic device is capable of performing a very accurate operation at a very high speed with low power.

DESCRIPTION OF PREFERRED EMBODIMENT

Figure 2A:
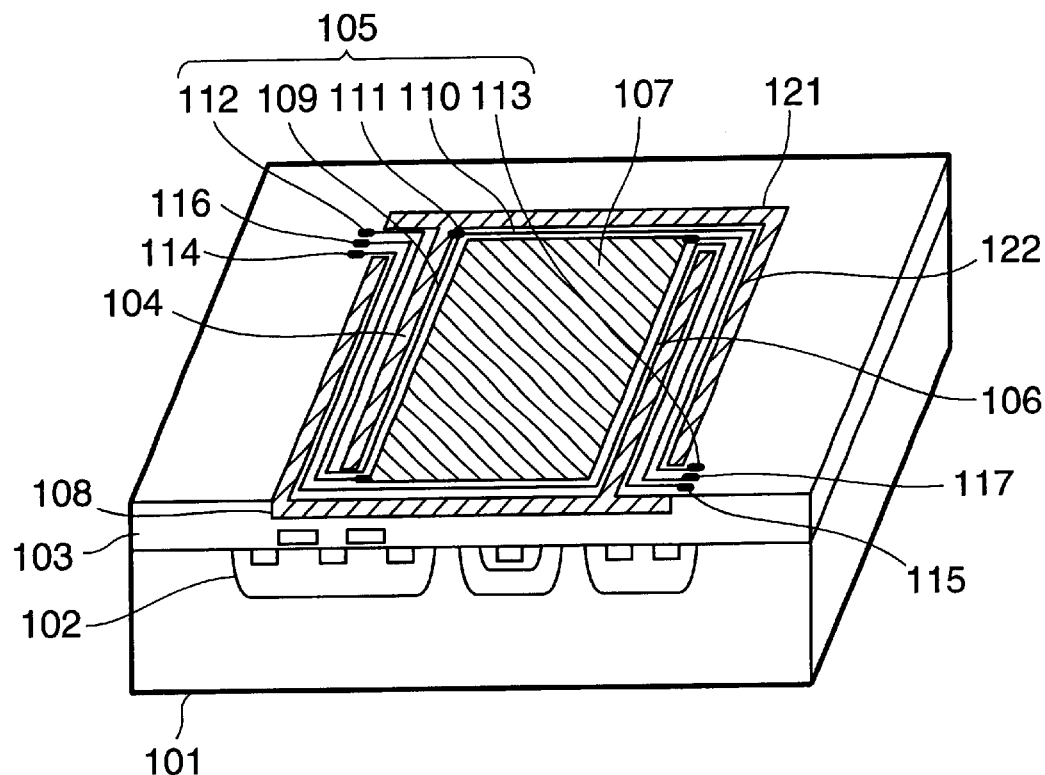
FIG. 2A is a perspective view of an embodiment of an electronic device according to the present invention.
Figure 2B:
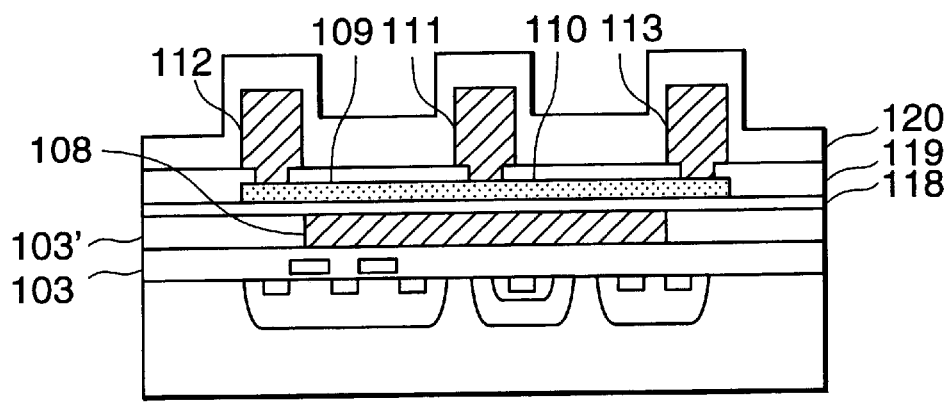
FIG. 2B is a cross-sectional view thereof.

First, the construction of an embodiment of an electronic device according to the present invention is described below. FIG. 2A is a perspective of an electronic device according to the present invention, and FIG. 2B is a cross-sectional view thereof taken along a thin film-shaped Peltier device.

This electronic device includes a circuit 102 formed in a substrate 101, a diaphragm 104 disposed on the circuit 102 via an insulating layer 103, an electrical-to-thermal transducer (or a converting device) 105 for converting an electrical signal to heat, a thermal-to-electrical transducer (or a converting device) 106 for converting heat to an electrical signal, and a functional material 107 whose peculiar physical property appears at a particular temperature.

In this event, the electrical-to-thermal transducer 105, the thermal-to-electrical transducer 106, and the functional material 107 are formed in a part of the layer of the diaphragm 104. The electrical-to-thermal transducer 105 is disposed on the diaphragm 104 or across the diaphragm 104 and the substrate serving as a heat sink such that the electrical-to-thermal transducer 105 is thermally isolated from the diaphragm.

Although not shown in the figure, the diaphragm may be disposed on the substrate 101 such that the diaphragm is isolated from the substrate 101 by a cavity. Such a structure may be created by anistropically etching the substrate 101. In this case, the circuit in the substrate is located adjacent to the diaphragm.

The substrate 101 may be formed of a semiconductor such as silicon. The substrate 101 may also be formed by depositing single-crystal silicon on an insulating substrate such as a sapphire substrate by means of an SOI technique. The circuit 102 processes a signal received from the thermal-to-electrical transducer 106 or the functional material 107. The circuit 102 also supplies an electrical signal to the electrical-to-thermal transducer 105 or the functional material 107 so that the diaphragm is controlled at a desirable temperature.

The diaphragm 104 includes a thin film which is formed in a cavity 108 in the insulating layer 103 such that the thin film is spaced from the bottom of the cavity 108. Herein, the functional material and the electrical-to-thermal transducer are formed in the thin film. The diaphragm 104 also includes a long and thin beam 122 for supporting the thin film. The long and thin beam 122 includes an interconnection wire for connecting the devices in the thin film and the circuit in the substrate.

The diaphragm has low thermal conductance to the substrate located adjacent the diaphragm. It is desirable that the diaphragm and the beam be also formed of a material having low thermal conductance, such as silicon oxide or silicon nitride.

As for the electrical-to-thermal transducer 105, it is desirable to employ a thin film-shaped Peltier device capable of absorbing and generating heat, although a device (heater) using Joule heat through a resistor or another device which converts an electrical signal to heat on the basis of another mechanism.

In the present embodiment, by way of example, a Peltier device is used as the electrical-to-thermal transducer. The thin film-shaped Peltier device is formed of two different materials connected to each other. When a current is passed through the Peltier device, heat is generated or absorbed at contacts between the two different materials (Peltier effect).

The amount of heat generated by a unit current is called the Peltier coefficient. Semiconductors generally have greater Peltier coefficients than metals. In semiconductors, the Peltier coefficient is opposite in polarity between p-type and n-type. Therefore, if a p-type semiconductor and an n-type semiconductor are connected to each other, a very large Peltier effect can be obtained. Examples of materials which can be used to form the Peltier device include $Bi_2Te_3$, $Sb_2Te_3$, and amorphous silicon or polysilicon doped with an impurity. Amorphous silicon or polysilicon has the advantage that they can be easily produced at low cost using a common silicon production line.

The thin film-shaped Peltier device 105 is formed by a p-type semiconductor 109 and an n-type semiconductor 110 and includes contacts 111, 112, and 113. The p-type semiconductor 109 and the n-type semiconductor 110 extend from the substrate to the diaphragm via the beam 122. The contact 111 is formed on the diaphragm, at the boundary between the p-type semiconductor 109 and the n-type semiconductor 110. The contact 112 is formed on the substrate, at the boundary between the p-type semiconductor and the circuit 102. The contact 113 is also formed on the substrate, but at the boundary between the n-type semiconductor and the circuit 102.

If a current is passed through the thin film-shaped Peltier device, heat is absorbed or generated at the contacts by the Peltier effect. In general, when the current is passed in a direction from the n-type semiconductor 110 toward the p-type semiconductor 109, heat is generated at the contact 112 formed on the substrate, and heat is absorbed at the contact 111 formed on the diaphragm.

The contacts 112 and 114 have a large thermal conductance to the substrate, and thus the heat generated at these contacts is rapidly transferred to the substrate serving as a heat sink. Therefore, the heat generated at the contacts 112 and 114 does not cause a significant change in temperature.

On the other hand, heat absorbed at the contact 111 formed on the diaphragm causes a reduction in temperature of the diaphragm, because the diaphragm has a small thermal conductance to an adjacent part in the vicinity of the diaphragm. If the current is passed in an opposite direction, an opposite phenomenon occurs, and the temperature of the diaphragm increases.

Figure 1:
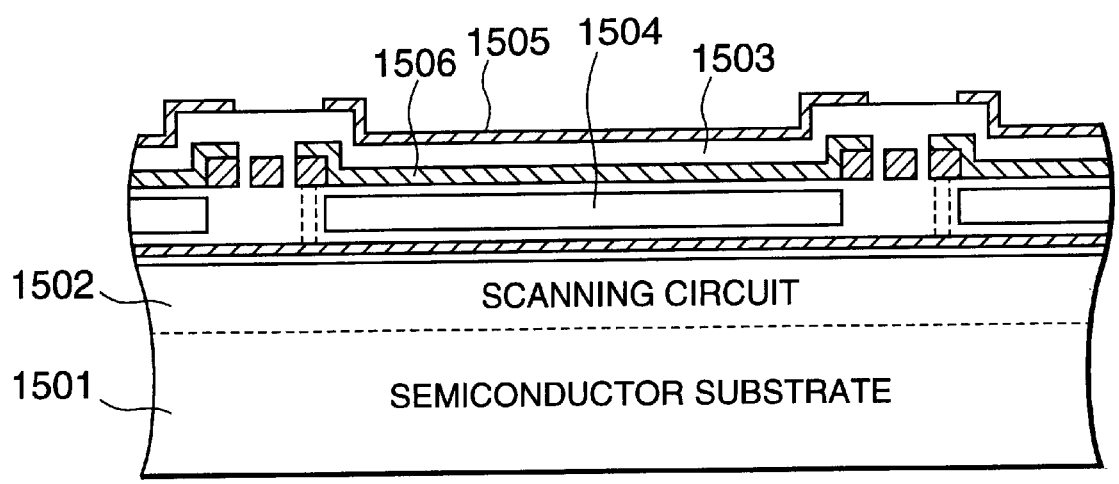
FIG. 1 is a cross-sectional view of a related infrared imaging device.

In the case of the diaphragm having the long beam 122 such as that shown in FIG. 1, when heat generation or absorption occurs in the diaphragm, most of temperature gradient occurs along the long beam 122 serving as the leg, and substantially no temperature gradient appears in the diaphragm. This is advantageous in that a functional material formed on the diaphragm has a uniform temperature distribution. The functional material will be described in detail later.

Because the temperature distribution of the diaphragm is uniform, it is allowed to dispose the thin film-shaped Peltier device 105 at any location on the diaphragm. However, it is desirable to dispose the thin film-shaped Peltier device 105 in a peripheral area of the diaphragm as shown in FIG. 2 so that the functional material 104 can use a large area of the diaphragm.

When a functional material having a large area is formed on the diaphragm, the diaphragm has to have a correspondingly large area, which can result in degradation in uniformity of temperature. The temperature uniformity can be improved by increasing the thickness of the diaphragm or forming a material with a high thermal conduction on the diaphragm.

The temperature uniformity may also be improved by forming an electrical-to-thermal transducer into the shape of a sheet over a large area of the diaphragm and then forming an interlayer insulating film thereon and finally forming the functional material on the interlayer insulating film.

Examples of the thermal-to-electrical transducer 106 include a bolometer using the temperature dependence of resistance, a thermocouple using thermal electromotive force (Seebeck effect) between different materials, a PN diode whose current varies depending on temperature, and a device using the temperature dependence of spontaneous polarization (pyroelectric effect) or that of the dielectric constant of a ferroelectric material.

Of these devices, the bolometer, the thermocouple, and the PN diode are advantageous in that materials thereof can be formed into a monolithic manner. The advantage of the bolometer is in that it has a high sensitivity and can measure the absolute temperature of the diaphragm.

The advantage of the thermocouple is that the thermocouple can be produced using the same materials as those of the Peltier device, and thus the production process becomes simple. In this event, the thermocouple serves to generate a change of an electromotive force in accordance with a temperature change. When impedance of a circuit coupled to the thermocouple becomes high, no current flows along the thermocouple. Thereby, electric power generated in the thermocouple can be set to approximately zero. Consequently, the thermocouple does not generate heat on the diaphragm. In the following description, the bolometer is employed, by way of example, as the thermal-to-electrical transducer.

As shown in FIG. 2, the bolometer 106 extends from the substrate to the diaphragm 104 via the beam 122. The bolometer is connected to the circuit 102 via contacts 114 and 115 formed on the substrate 114. It is desirable to dispose the bolometer in a peripheral area of the diaphragm so that the functional material can use a large area of the diaphragm.

The bolometer is preferably formed of a material having a large TCR and low 1/f noise. Vanadium oxide, titanium oxide, and those metal oxides doped with an impurity has a TCR as large as 2%/K and low 1/f noise, and thus these materials are suitable for the bolometer. Titanium, polysilicon, amorphous silicon, and silicon-germanium are preferable in that they have rather large TCRs in the range from 0.2%/K to 2%/K and can be formed using a silicon production process.

Titanium has a TCR of 0.2%/K to 0.5%/K which is greater than those of other metals. Compared with the other metals, titanium has a relatively low thermal conductance such as 0.1 W/cm/K, which allows the diaphragm to have a low thermal conductance.

Furthermore, titanium has, as other metals generally have, an advantage that titanium has greater number of carries and thus exhibits extremely low 1/f noise. The advantage of the bolometer formed by silicon is that it has a small-thermal conductance of about 0.2%/K and can be produced at the same time as the thin film-shaped Peltier device using silicon. This allows simplification in the production process.

Figure 3A:
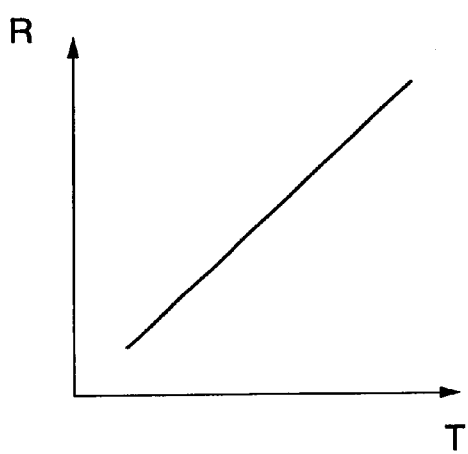
FIGS. 3A and 3B are graphs illustrating characteristics of a bolometer.
Figure 3B:
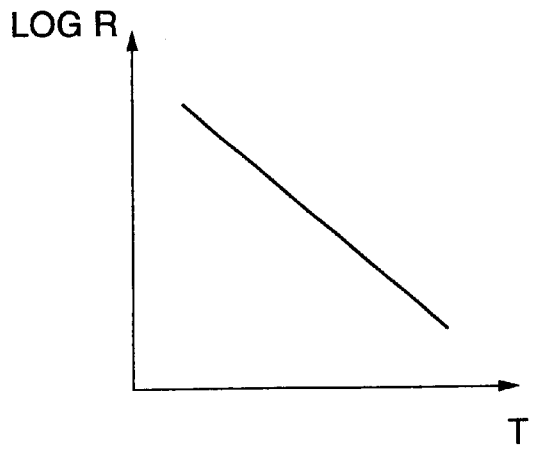

In FIGS. 3A and 3B, the horizontal axis represents the absolute temperature, and thus it is possible to determine the absolute temperature of the diaphragm by measuring the resistance. Although the metals generally have a small resistance temperature coefficient (TCR), the advantage of metals is that the resistance increases monotonically within a wide temperature range.

In FIGS. 3A and 3B, the horizontal axis represents the absolute temperature, and thus it is possible to determine the absolute temperature of the diaphragm by measuring the resistance. Although themetals generally has a small resistance temperature coefficient (TCR), the advantage of metals is that the resistance increases monotonically within a wide temperature range.

In the example shown in FIG. 3B, a semiconductor such as silicon is used. In this case, the resistance has a negative temperature coefficient. The advantage of the semiconductors is that the resistance varies exponentially with temperature and thus a high sensitivity can be obtained. In the case of metal oxides, some of them exhibit a characteristic similar to that of semiconductors as shown in FIG. 3B.

However, some metal oxides exhibit a characteristic similar to that of metals as shown in FIG. 3A. Furthermore, some metal oxides behave like a semiconductor in a certain temperature range and like a metal in another temperature range.

Alternatively, a thermocouple may be employed as the thermal-to-electrical transducer. When the thermocouple is used, a temperature difference between two contacts via which two different materials are connected to each other is converted to a voltage. If one contact is formed on the diaphragm and the other contact is formed on the semiconductor substrate, it is possible to detect a change in energy on the diaphragm.

In this case, the detected temperature represents a relative value with respect to the temperature of the substrate. Therefore, to determine the absolute value of the temperature of the diaphragm, it is required to detect the absolute value of the temperature of the substrate using a bolometer or the like.

The thermocouple is preferably formed using materials having large Seebeck coefficients. Amorphous silicon or polysilicon doped with boron or arsenic has the advantage that it can be easily produced using a semiconductor production line and has a large Seebeck coefficient of the order of 0.5 mV/K. The Seebeck coefficients of p-type silicon doped with boron and n-type silicon doped with arsenic are opposite in polarity to each other. Therefore, if p-type silicon doped with boron and n-type silicon doped with arsenic are used as two different materials to form a thermocouple, the resultant thermocouple can generate a large thermal electromotive force.

A PN diode may also be used as the thermal-to-electrical transducer. The PN diode may be formed of p-type silicon and n-type silicon, and the temperature dependence of a current passed through the PN diode in a forward or reverse direction may be used to detect temperature.

Alternatively, a Schottky diode formed of a metal and a semiconductor may also be employed. Also in this case, the temperature dependence of a current in a forward or reverse direction is used to detect temperature.

The invention is now described below in terms of the production method. A method of producing the electronic device according to the present invention is described with reference to FIG. 2. The circuit 102 is formed in the semiconductor substrate 101 using a common LSI production process. The circuit may be formed using circuit elements ,such as, a CMOS transistor, a bipolar transistor, a diffusion resistor, and a capacitor.

An operational amplifier using bipolar transistors has the advantage that a low signal-to-noise ratio, a low offset voltage, and a low drift are obtained. However, depending on specifications, an analog circuit formed of mainly CMOS transistors may also be employed. In this case, the advantage is that the circuit can be produced with a small number of production steps and thus at low cost.

As for the insulating layer 103, a silicon oxide film or the like may be employed. In particular, BPSG doped with boron or phosphorus is desirable in that good step coverage can be achieved. The silicon oxide film 103 is formed in two steps so as to form a cavity 108 under the diaphragm 104.

More specifically, after forming a first layer of the silicon oxide film 103 with a thickness of about 1 μm, polysilicon with a thickness of about 1 μm, which will become cavity later, is formed and patterned. Thereafter, a second layer of the silicon oxide film 103 with a thickness of about 1 μm is formed.

Furthermore, another silicon oxide film 118 with a thickness of about 0.1 μm is formed thereon. Finally, polysilicon 109 and 110 with a thickness of about 0.1 μm are deposited thereby forming the thin film-shaped Peltier device.

In the above process, the polysilicon 109 is p-doped with boron by means of ion implantation, and the polysilicon 110 is n-doped with phosphorus or arsenic. The impurity concentration of the polysilicon is too high, the Seebeck coefficient and the Peltier coefficient become low. To avoid the above problem, the impurities are doped within the range of $10^{18}$ to $10^{20}$ cm$^{-3}$. On the other hand, if the impurity concentration is lower than $10^{18}$ cm$^{-3}$, the specific resistance becomes extremely great.

Furthermore, on the silicon oxide film 118, titanium with a thickness of about 0.1 μm serving as the thermal-to-electrical transducer 106 and the functional material such as YBa$_2$Cu$_3$O$_7$ (YBCO) with a thickness of about 0.1 μm are formed. In the case where a SIS (superconductor-insulator-superconductor) structure, which will be described in detail later, is formed, an insulating layer such as silicon oxide film is further formed, and then YBCO with a thickness of about 0.1 μm is formed.

After further forming a silicon oxide film 119 with a thickness of about several hundred nm on the thin film-shaped Peltier device, the thermal-to-electrical transducer, and the SIS structure, contact holes are formed and then aluminum with a thickness of several hundred nm is deposited. This aluminum layer will be patterned later into interconnection wires of the circuit 102 and contacts 111–117. On the aluminum, a silicon oxide film 120 with a thickness of several hundred nm for protecting the aluminum is formed.

Finally, to form the cavity 108, a slit 121 reaching the polysilicon 108 is opened, and then etching is performed. As described above, the diaphragm can be easily formed by first forming a dummy layer (or a sacrifice layer) at a location corresponding to the cavity 108, and then forming a constituent material of the diaphragm on the dummy layer, and finally removing the dummy layer by means of etching.

Herein, it is to be noted that the dummy layer may be formed using polysilicon, polyimide, or the like. The thickness of the dummy layer is preferably set to about 1 μm so as to space the diaphragm from the underlying layer. The etching is stopped when the polysilicon 108 is completely removed. The cavity may also be formed by means of anisotropic etching. To this end, a known etchant such as KOH, TMAH, or hydrazine may be used.

The area of the diaphragm may be selected to a proper value in a wide range from 10 μm square to 20 mm square, depending on the size of the functional material formed on the diaphragm. In this event, the diaphragm may be formed by means of exposure using a step and repeat exposure apparatus or the like.

The thickness of the diaphragm and the beam may be selected to a proper value in a wide range from 100 nm to 10 μm. The diaphragm and the beam with a thickness as small as 100 nm can support the functional material, although the minimum required thickness depends on the area of the diaphragm. If the diaphragm and the beams are formed to be as thick as 10 μm, the uniformity of temperature of the diaphragm can be improved.

The material such as silicon oxide or silicon nitride used to form the diaphragm and the beam may be deposited by means of CVD or the like. In order to reduce the deposition time and the stress in the film, it is desirable that the thickness of the diaphragm and the beam be smaller than 1 μm.

The technique of forming a cavity on the surface of a substrate is called surface micro machining. This technique is also used in the art of infrared sensors. In the art of acceleration sensors or the like, a technique called bulk micro machining is used to form a V-shaped groove in a substrate. The surface micro machining technique is employed in the present embodiment, because the surface micro machining technique allows the circuit 102 to be formed below the diaphragm. However, the bulk micro machining technique may also be employed depending on the specifications. For example, a cavity 108 with a large height can be formed using the bulk micro machining technique.

Figure 4A:
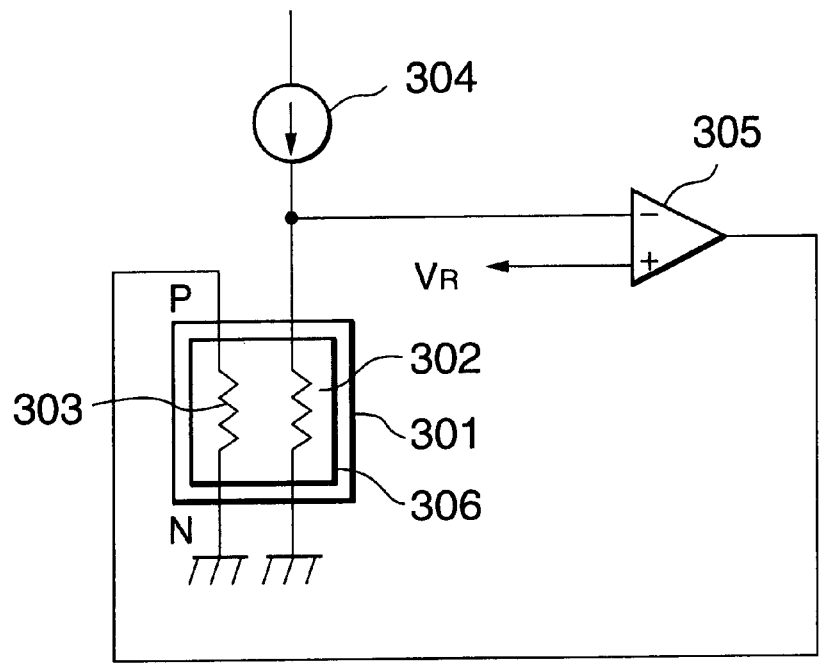
FIGS. 4A through 4C are circuit diagrams illustrating a circuit configuration according to an embodiment of the present invention.

The operation of the present invention is now described below. FIG. 4A illustrates a specific example of the electronic device circuit shown in FIG. 2. Because this circuit deals with a very small signal, it is desirable to form the circuit in the same substrate as that on which the diaphragm is formed.

The thermal-to-electrical transducer 302, thin film-shaped Peltier device 303, and the functional material 306 are formed on the diaphragm. A constant current supplied from a constant current source 304 is passed through the thermal-to-electrical transducer 302 so that a resistance variation is converted to a voltage variation. This voltage is applied to an operational amplifier 305 and compared with a reference voltage VR.

Depending on the comparison result, the operational amplifier 305 controls the thin film-shaped Peltier device so that the voltage output from the thermal-o-electrical transducer 302 becomes equal to the reference voltage VR. The resistance of the thermal-to-electrical transducer varies, for example, as shown in FIG. 3A. Therefore, the temperature of the diaphragm can be controlled at a desired temperature if the reference voltage is set to a value corresponding to the desired temperature.

More specifically, when the thermal-to-electrical transducer has resistance of 10 Ω at an absolute temperature of 77K, if a constant current of 100 μA is passed through the thermal-to-electrical transducer and if 1 V is applied as the reference voltage VR, the temperate of the diaphragm is set to 77K.

In Peltier devices, if a current is passed from a p-type semiconductor to an n-type semiconductor, heat is generated. If a current is passed in an opposite direction, heat is absorbed. Herein, the thermal-to-electrical transducer 302 is assumed to be formed of titanium having a positive temperature coefficient of resistance.

Figure 4B:
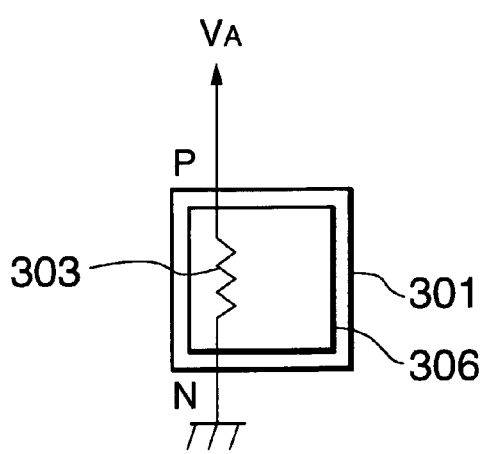
Figure 4C:
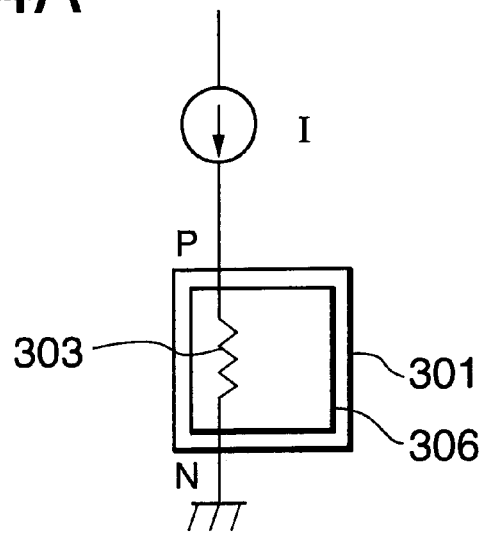

If the p-type semiconductor of the thin film-shaped Peltier device is connected to the output of the operational amplifier and the thermal-to-electrical transducer 302 is connected to the negative input terminal of the operational amplifier as shown in FIGS. 4A through 4C, the above-described control becomes possible. (Alternatively, the n-type semiconductor of the thin film-shaped Peltier device may be connected to the output of the operational amplifier, and the thermal-to-electrical transducer may be connected to the positive input terminal of the operational amplifier.)

Note that a polysilicon bolometer and most of metal oxide bolometers have negative temperature coefficients of resistance, and thus the n-type semiconductor should be connected to the output of the operational amplifier and the thermal-to-electrical transducer should be connected to the negative input terminal of the operational amplifier. (Or otherwise, the p-type semiconductor is connected to the output and the thermal-to-electrical transducer is connected to the positive input terminal.)

The amount of heat, W, generated or absorbed per unit time by a Peltier device is given by equation (1) described below, where Π is the Peltier coefficient and |I| is the current passed through the Peltier device.

$$W = \Pi |I| \qquad (1)$$

The Peltier device formed of p-type and n-type silicon connected to each other has a Peltier coefficient of about 0.8 J/C over a wide temperate range below 400 K (Yoshio Inuishi et al., "Properties of Semiconductors", p. 223, Asakura-Shoten). The temperature difference ΔT of the diaphragm can be represented by the energy difference ΔW and the thermal conductance Gth of the diaphragm as shown in the following equation (2).

$$\Delta T = \frac{\Delta W}{G_{th}} \qquad (2)$$

It is practically possible to obtain Gth as small as 0.1 μW/K. In this case, as can be seen from equations (1) and (2), the temperature of the diaphragm can be set to, for example, 77K by passing a current of 28 μA through the thin film-shaped Peltier device.

The above calculation is performed on the assumption that the functional material on the diaphragm does not generate heat. In practice, to maintain the diaphragm at a constant temperature, it is required to increase the current passing through thin film-shaped Peltier device depending on the amount of heat generated by the functional material. This can be automatically achieved if the circuit shown in FIG. 4A is employed.

The temperature of the diaphragm may be set to various values depending on the type and the characteristics of the functional material formed on the diaphragm. For example, $YBa_2Cu_3O_7$ (yttrium barium copper oxide, hereinafter referred to as YBCO) is a superconducting material having a critical temperature near the temperature of liquid nitrogen (77K) below which YBCO becomes superconductive.

Thus, in order to use the superconductivity of YBCO, it is required to cool YBCO to a temperature lower than the critical temperature. On the other hand, barium titanate is a ferroelectric material having a transition temperature (Curie temperature) of about 130° C. at which a transition between ferroelectricity and paraelectricity occurs. Therefore, if barium titanate is used at a rather high temperature near the transition temperature, a high dielectric constant and a high pyroelectric coefficient can be obtained.

Thus, the temperature of the diaphragm is set to a temperature near 77K in some application and 130° C. in another application, or to another different temperature at which the functional material formed on the diaphragm exhibits a peculiar physical property. That is, an electric signal is sent to the electrical-to-thermal transducer on the diaphragm, depending on the type and characteristics of the functional material formed on the diaphragm so that the diaphragm is controlled at a desired temperature.

When the functional material is used at a temperature near room temperature in the range from 0° C. to 50° C., a conventional heater or cooler may be employed. Thus, the present invention is particularly useful when the functional material is used at a temperature which cannot be covered by the conventional heater or cooler. However, of course, the present invention can provide the advantages of the small size, the light weight, and the low power consumption for any temperature.

Herein, attention must be paid for the temperature dependence of the Peltier coefficient when the Peltier device is used in an extremely wide temperature range. The temperature dependence of the Peltier coefficient can be represented by equation (3):

$$\Pi = \frac{\varepsilon_C - \varepsilon_F}{e} + \frac{3kT}{2e} \qquad (3)$$

where $\varepsilon_C$ is the energy of the bottom of the conduction band, $\varepsilon_F$ is the Fermi level, and e is electronic charge. It can be seen from equation (3), the Peltier coefficient Π increases monotonically with absolute temperature. At a temperate near 77K, the Peltier coefficient decreases to about ⅔ of that at room temperature. However, the reduction in the Peltier coefficient does not cause a significant problem, because the Peltier coefficient at room temperature is very large (Yoshio Inuishi et al., "Properties of Semiconductors", p. 223, Asakura-Shoten).

At high temperatures, the Peltier coefficient has higher values than at room temperature. However, in the case of silicon, it becomes intrinsic at temperatures higher than 200° C. and thus the Peltier coefficient decreases abruptly. For this reason, the Peltier device formed of silicon should be used at temperatures lower than 200° C.

Regardless of whether the Peltier device is used at a low temperature or a high temperature, if the circuit configuration shown in FIG. 4A is used, the temperature automatically converges to the set value without needing complicated setting.

FIG. 4B illustrates an example in which the thin film-shaped Peltier device is directly connected a voltage source $V_A$ without using an operational amplifier. In this structure, the thermal-to-electrical transducer and the operational amplifier are not required. Such a structure may be employed in some applications, because the relationship between the diaphragm temperature and the current flowing through the thin film-shaped Peltier device can be determined by means of a calculation or can be experimentally determined.

The characteristics of the thin film-shaped Peltier device vary from chip to chip, from wafer to wafer, and from lot to lot. Therefore, the thin film-shaped Peltier device can be used when it is not required to very precisely control the temperature of the functional material 306 at a set value or when the amount of heat generated by the functional material does not vary greatly.

FIG. 4C illustrates an example in which the thin film-shaped Peltier device is directly connected a current source U without using an operational amplifier. As in the example shown in FIG. 4B, the thermal-to-electrical transducer and the operational amplifier are not required.

The advantages of the present invention are summarized below. First, a cooler or a heater can be realized in an extremely small form with an extremely light weight. As described above, the diaphragm can be produced on a silicon chip using a common silicon process such that the diaphragm has a small size in the range from 10 μm square to 20 mm square depending on the size of the functional material. The cooler and the heater according to the present invention operates with extremely low power, because the diaphragm has an extremely low thermal conductance.

More specifically, a very low temperature such as 77K can be achieved with power as small as a few ten μW. The above-described features of the small size, the light weight, and the low power consumption can be achieved by forming the functional device and the thin film-shaped Peltier device on the diaphragm serving as the thermally isolated element.

A second advantage is that the configuration shown in FIG. 4A allows elimination of the influences of the thermal time constant of the diaphragm. Thus, it becomes possible to greatly improve the response speed in terms of the temperature control. The temperature of the diaphragm varies in a finite period of time depending on the thermal time constant (usually of the order of 10 msec) specific to the diaphragm.

However, because the diaphragm has a small thickness of the order of 1 μm and thus has a small specific thermal time constant, it is possible to change the temperature of the material in an extremely short time of the order of a few ten μsec by controlling the diaphragm by means of a feedback control technique using an operational amplifier illustrated in FIG. 4A.

Figure 7:
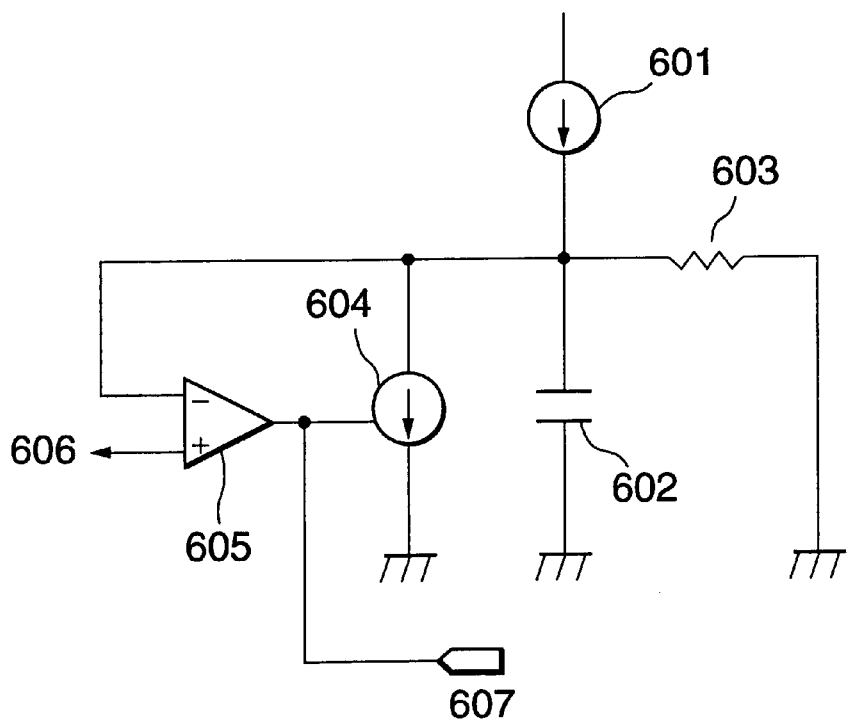
FIG. 7 is a circuit diagram illustrating an equivalent circuit of an embodiment of the present invention.

The above phenomenon can be understood by replacing the above thermal phenomenon by an equivalent electric circuit as shown in FIG. 7. The change in the amount of heat of the diaphragm is equivalently replaced by a current source 601, the heat capacity of the diaphragm by a capacitor 602, the thermal resistance of the diaphragm by a resistor 603, and the Peltier device by a voltage controlled current source 604.

Simulation of this equivalent electric circuit using a circuit simulator has revealed that a signal proportional to the change in the current of the current source 601 appears at the output 607 of the operational amplifier 605, and that the voltages of the two inputs of the operational amplifier are always equal to each other.

This implies that a disturbance imposed upon the diaphragm is cancelled out by the system. The above response occurs at a high speed partially because of the low value, such as a few nJ/K, of the heat capacity of the diaphragm.

The lower limit of the response time of the structure shown in FIG. 4A is determined mainly by the response time of the operational amplifier 305 and the CR time constant associated with the interconnection wires. In general, the above response time is much smaller than the thermal time constant of the diaphragm. This makes the present invention to be particularly useful in that the thermal time constant of the diaphragm can be neglected.

A third advantage is that the temperature can be precisely controlled at a set value. In particular, extremely precise temperature control can be achieved by employing the structure shown in FIG. 4A in which the signal from the thermal-to-electrical transducer is compared with the reference voltage VR by the operational amplifier, and the comparison result is fed back to the thin film-shaped Peltier device.

Figure 5A:
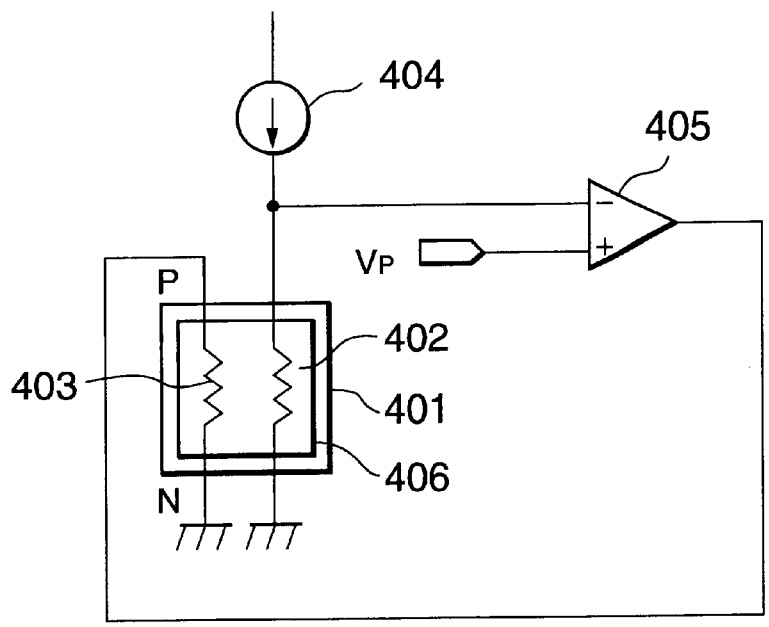
FIGS. 5A through 5C are circuit diagrams illustrating a circuit configuration according to another embodiment of the present invention.

FIG. 5A illustrates an example in which the temperature of the diaphragm, that is, the temperature of the functional material is changed in real time. In this example, a temperature control voltage Vp is applied instead of the reference voltage VR used in the example shown in FIGS. 4A through 4C.

Figure 5B:
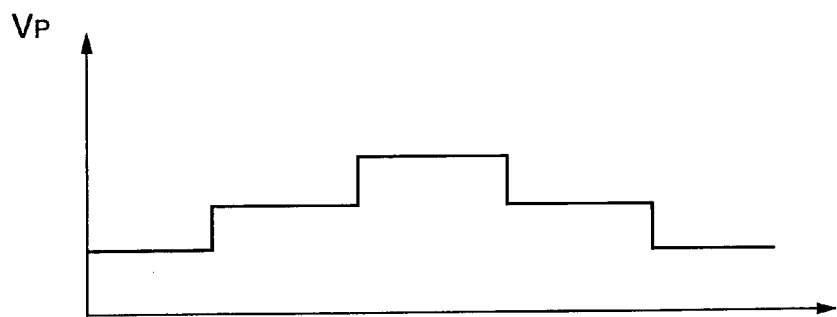
Figure 5C:
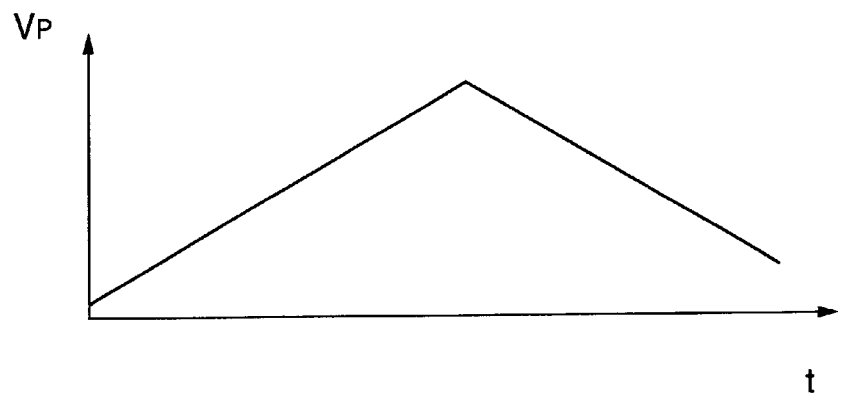
Figure 6:
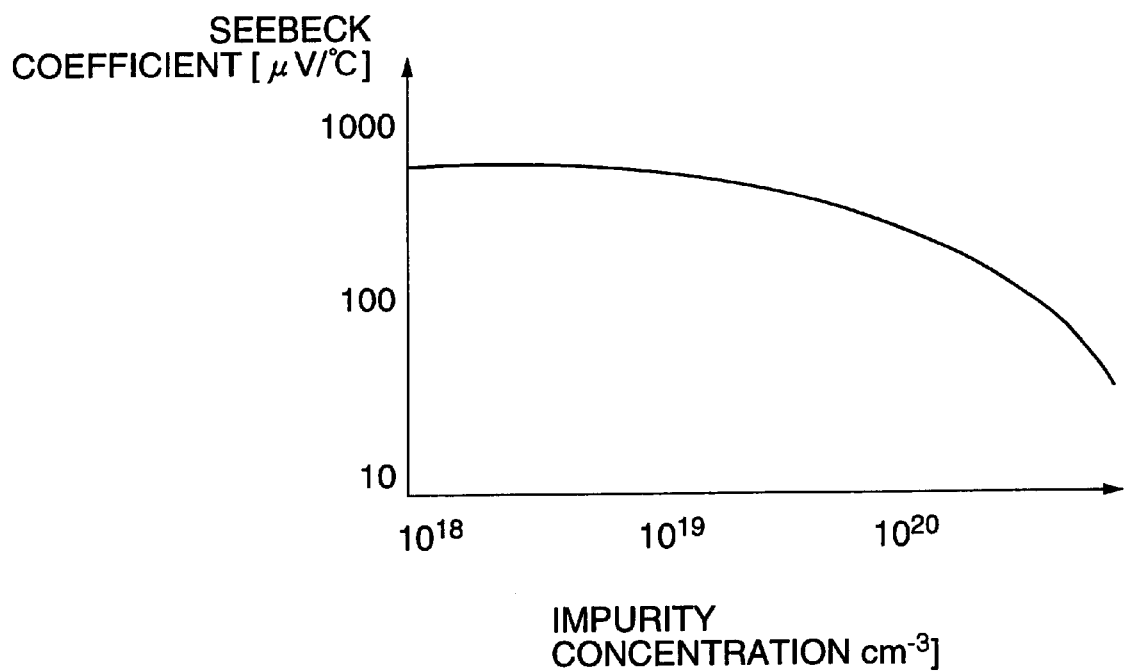
FIG. 6 is a graph illustrating the Seebeck coefficient as a function of the impurity concentration.

More specifically, for example, a signal with a stepped waveform such as that shown in FIG. 5B is applied as the temperature control voltage Vp. Consequently, the temperature of the functional material is changed in a stepped manner thereby using various physical properties appearing at various temperatures.

Alternatively, a signal with a ramp waveform may be employed as Vp so as to continuously change the temperature of the functional material. As mentioned above, this system composed of the thermal-to-electrical transducer, the operational amplifier, and the thin film-shaped Peltier device can respond at a very high speed.

Further, it is possible to change the set temperature at a frequency of the order of several hundred kHz (in time of the order of a few ten μsec) determined by the cutoff frequency of the operational amplifier and the impedance of the thin film-shaped Peltier device.

A still another advantage is that it is possible to form a plurality of diaphragms and form different materials on the respective diaphragms thereby controlling the temperatures of the diaphragms at values optimum for the respective materials.

Alternatively, materials, which are of the same type, may be formed on the respective diaphragms, and the temperatures of the respective diaphragms may be controlled at various values which allow the different physical properties of the materials of the same type to be used.

Still alternatively, materials, which are of the same type, may be formed on the respectively diaphragms and the temperatures of the respective diaphragms may be controlled at the same value so as to realize an electronic device which needs a plurality of devices of the same type, such as a detector for detecting a multidimensional physical phenomenon, a memory circuit, various types of actuators for actuating various mechanisms, a display, a measuring apparatus, a control circuit, a logic circuit, and a signal processing circuit.

(First example)

Figure 8:
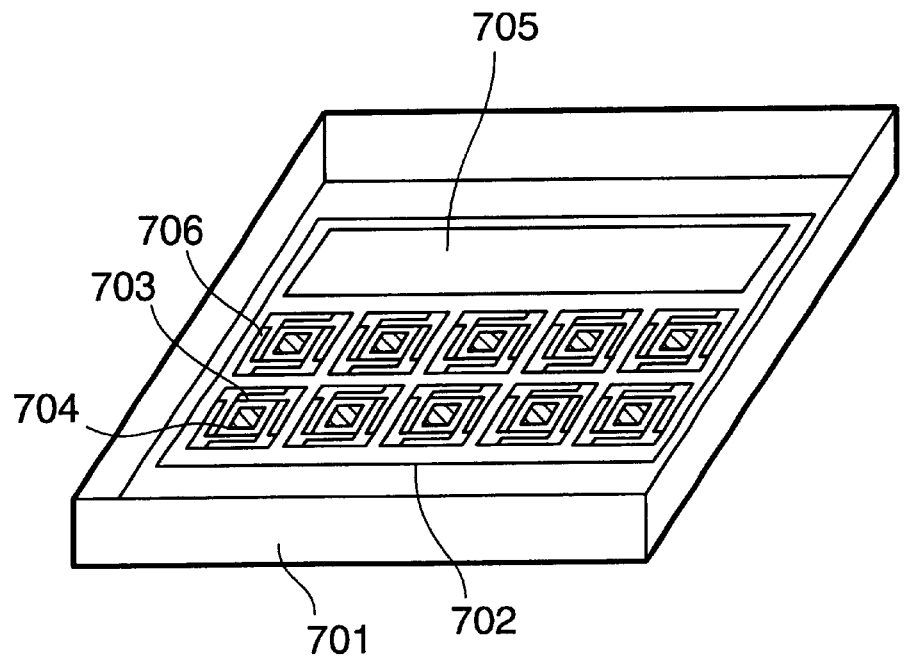
FIG. 8 is a schematic diagram illustrating a first example of an electronic device according to the present invention.

FIG. 8 illustrates the general construction of an electronic device according to a first example of the present invention.

A substrate 702 is disposed inside an evacuated package 701. The substrate 702 includes a plurality of diaphragms 703 and a circuit 705. In this case, the diaphragms 703 and the circuit 705 are formed on the substrate 702, and functional materials 704 are formed on the respective diaphragms 703.

Each diaphragm 703 has a beam 706 for supporting the diaphragm 703, a thermal-to-electrical transducer, and a thin film-shaped Peltier device. In this event, the diaphragm is controlled at a constant temperature. The circuit 705 controls the temperature of the diaphragm, controls the functional materials, and performs a logical operation or another processing upon signals received from the functional material.

(Second example)

Figure 9:
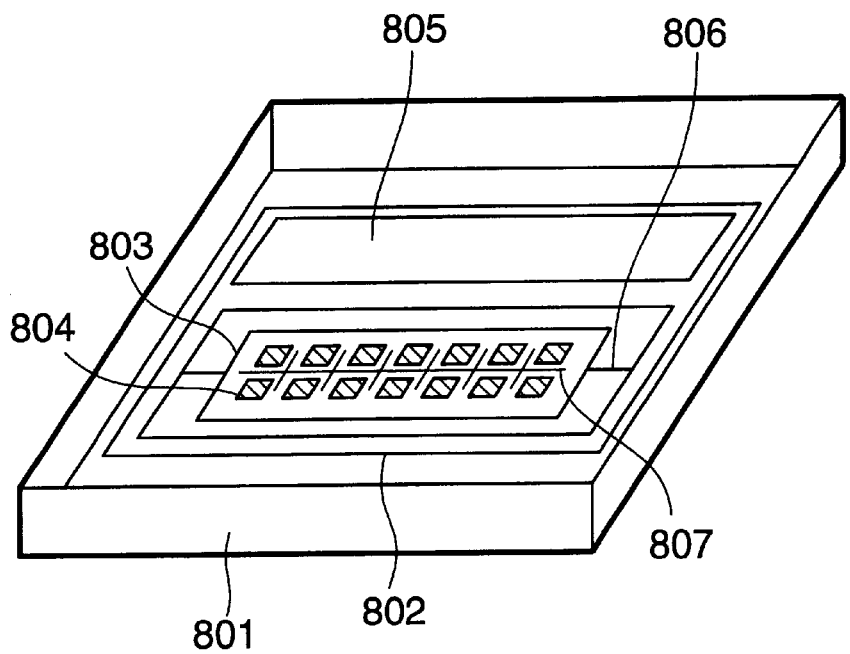
FIG. 9 is a schematic diagram illustrating a second example of an electronic device according to the present invention.

FIG. 9 illustrates an example including a single diaphragm 803 on which a thermal-to-electrical transducer, a thin film-shaped Peltier device, and a plurality of functional materials 804 are formed. The functional materials are connected to one another via interconnection wires 807. The interconnection wires 807 may be formed of a superconducting material having no resistance.

A circuit 805, as in the example shown in FIG. 8, controls the temperature of the diaphragm, controls the functional materials, and performs a logical operation or another processing upon signals received from the functional materials.

The diaphragm 803 may be formed by the use of the surface micro machining technique described earlier. In the case where the diaphragm has a large area such as a few mm square, the bulk micro machining technique may be employed to form the diaphragm so as to prevent the diaphragm from being in contact with an underlying layer.

By employing a low-noise circuit such as a SIS detector or a GaAs FET as the functional material 804 and also employing a superconducting material to form the interconnection wires 807, it is possible to perform an extremely low noise operation such as detection, amplification, frequency-multiplication, frequency-mixing, oscillation, and modulation upon an electromagnetic wave in a microwave or millimeter wave range.

The temperature of the diaphragm is set to, for example, a value near 77K at which the YBCO exhibits superconductivity or to a value in the range from 50 to 200 K at which a compound semiconductor device such as a GaAs FET has a high carrier mobility and/or a low-noise characteristic.

The improvement in the noise characteristic is partially due to a reduction in the intersurface state density at low temperatures.

In some cases, a problem can occur due to heat generated by an active device formed on the diaphragm. Even when heat is generated by such an active device, the diaphragm can be maintained at a constant temperature by increasing the number of thin film-shaped Peltier devices or enhancing the ability of the thin film-shaped Peltier device.

If a portable device such as a portable telephone device is formed using a superconducting element according to the present invention, a great improvement in the signal-to-noise ratio can be achieved.

(Third example)

Figure 10:
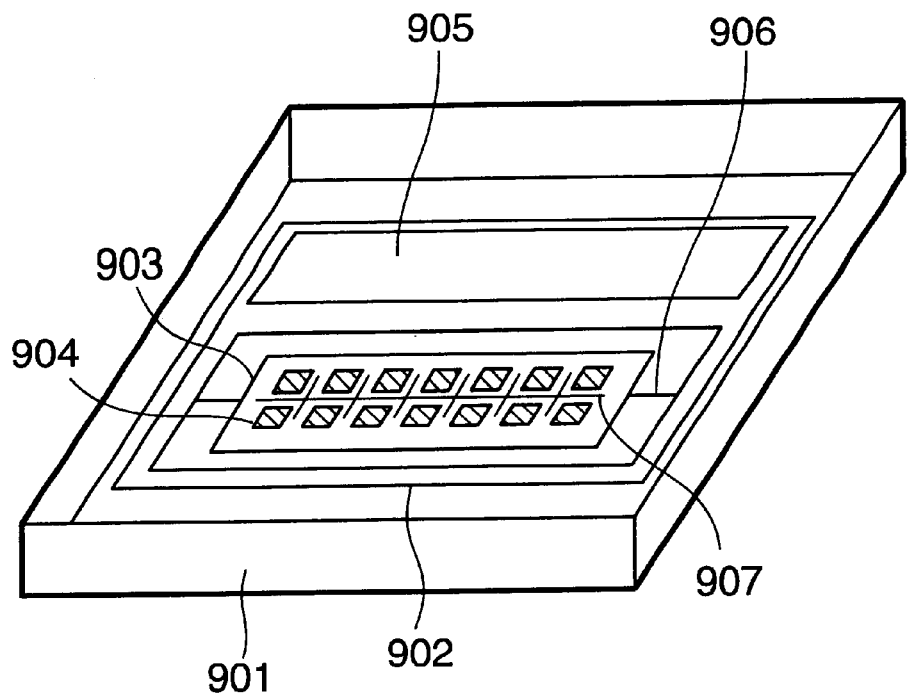
FIG. 10 is a schematic diagram illustrating a third example of an electronic device according to the present invention.

FIG. 10 illustrates an example in which the present invention is applied to an ultra-high speed processor. On the diaphragm, formed are a thermal-to-electrical transducer, a thin film-shaped Peltier device, high-speed operation device 904 such as a Josephson device or HEMT, and superconducting interconnection wires 907.

Also in this example, the surface micro machining technique or the bulk micro machining technique may be used. Josephson devices and HEMTs are capable of switching a digital signal at a very high speed.

The superconducting interconnection wires has no resistance, and thus no propagation delay along the interconnection wires occurs. The temperature of the diaphragm is set to, for example, a value near 77K at which the YBCO exhibits superconductivity. The present invention makes it possible to realize a portable device such as a portable computer using a superconducting device and capable of operating at a very high speed similar to that of super computers.

(Fourth example)

Figure 11:
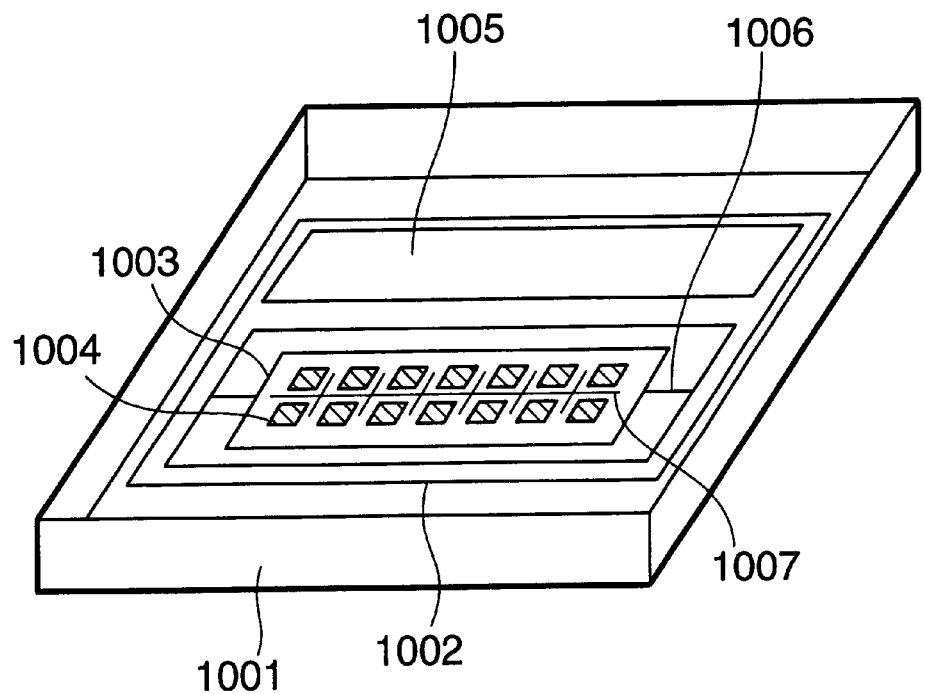
FIG. 11 is a schematic diagram illustrating a fourth example of an electronic device according to the present invention.

FIG. 11 illustrates an example in which the present invention is applied to a ferroelectric memory. A thermal-to-electrical transducer, a thin film-shaped Peltier device, and ferroelectric memories 1004 are formed on a diaphragm. Also in this example, the surface micro machining technique or the bulk micro machining technique may be used.

The gate oxide film of each ferroelectric memory is formed of a ferroelectric material such as barium titanate, and thus the temperature of the diaphragm is set to a value near its Curie temperature, for example, 130° C.

The dielectric constants of ferroelectric materials such as barium titanate increase to extremely large levels at temperatures near their Curie temperatures. This feature makes it possible to realize a memory in which a great number of memory cells each having a small cell size are integrated.

To realize such a memory, it is essentially required to precisely control the temperature at a value near the Curie temperature. To this end, the temperature control technique using the thermal-to-electrical transducer, the operational amplifier, and the thin film-shaped Peltier device according to the present invention is particularly useful.

(Fifth example)

Figure 12:
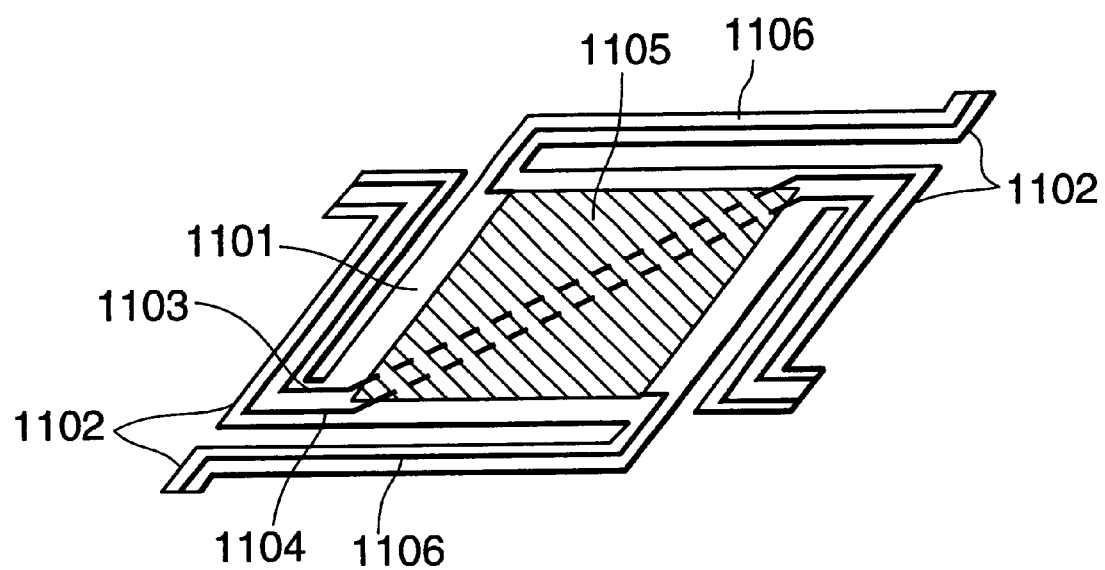
FIG. 12 is a schematic diagram illustrating a fifth example of an electronic device according to the present invention.

FIG. 12 illustrates another example in which a functional material is disposed on a diaphragm. The diaphragm includes a temperature control surface 1101 and a plurality of long beams 1102. A functional material 1105, a thin film-shaped Peltier device 1103, and a thermal-to-electrical transducer 1104 are formed on the temperature control surface 1101.

Each beam 1102 includes an interconnection wire for transmitting a signal from the functional material 1105, the Peltier device 1103, or the thermal-to-electrical transducer 1104. The functional material 1105 may be formed so as to serve, for example, as a quantum detector whose capability of detecting an infrared ray appears when it is cooled to a low temperature.

The quantum detector may be formed using a semiconductor material such as mercury cadmium tellurium or indium antimony. By disposing a large number of such quantum detectors as shown in FIG. 8 or 9, it is possible to realize a high-sensitivity low-noise detector with an extremely small size at low cost.

Alternatively, a III-V semiconductor laser may be formed as the functional material 1105. The oscillation frequency of the semiconductor laser depends on temperature. Therefore, it is possible to change the oscillation frequency of the semiconductor laser by varying the temperature of the diaphragm using the electrical-to-thermal transducer.

(Sixth example)

Figure 13:
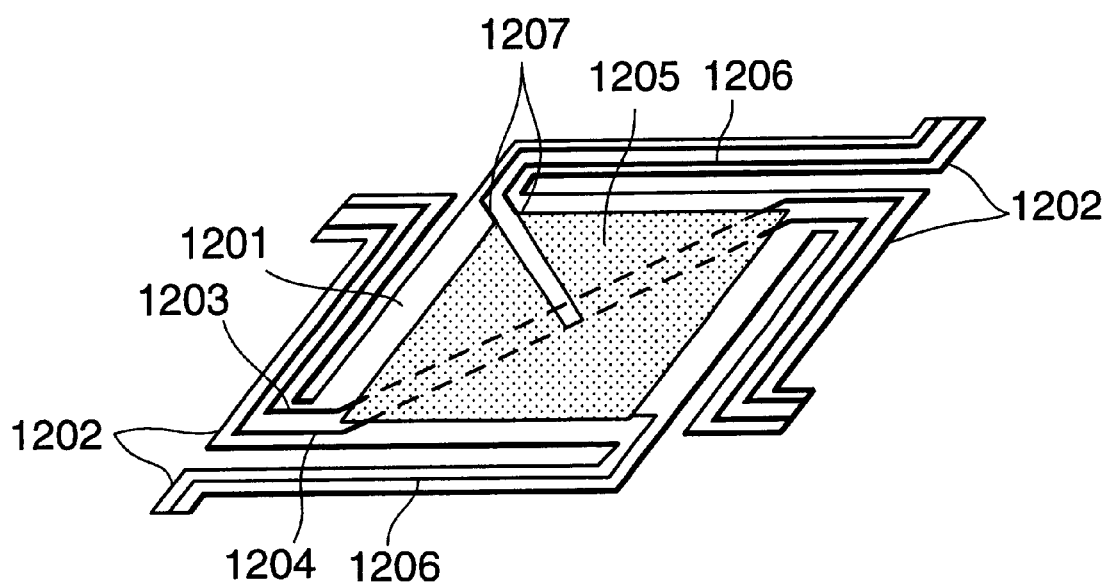
FIG. 13 is a schematic diagram illustrating a sixth example of an electronic device according to the present invention.

FIG. 13 illustrates an example in which a SQUID (superconducting quantum interference device) 1205, a thin film-shaped Peltier device 1203, and a thermal-to-electrical transducer 1204 are disposed on a diaphragm. The SQUID has a Josephson junction 1207 capable of detecting an extremely small change in a magnetic field and outputting a corresponding voltage signal. Thus, the SQUID can be used as a detector.

(Seventh example)

Figure 14:
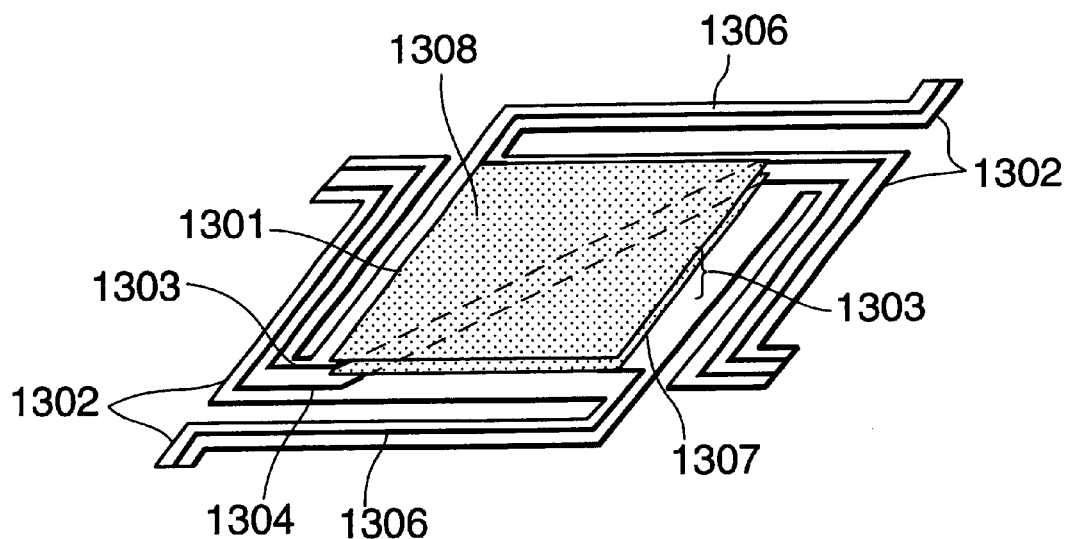
FIG. 14 is a schematic diagram illustrating a seventh example of an electronic device according to the present invention.

FIG. 14 illustrates an example in which a first superconducting element 1307, a second superconducting element 1308, a SIS junction (superconducting tunnel junction) 1305, a thin film-shaped Peltier device 1303, and a thermal-to-electrical transducer 1304 are disposed on a diaphragm.

The SIS junction has a structure consisting of an insulating film disposed between two superconducting electrodes wherein the thickness of the insulating film is selected to be so small that electrons can pass through the insulating film.

If an electromagnetic wave such as a microwave is incident on the SIS junction, a tunnel current flows and thus the electromagnetic wave is detected. Niobium is generally used as the superconductive material. However, other high-temperature superconducting materials such as YBCO may also be employed.

YBCO becomes superconductive when it is cooled at a temperature near 77K. To this end, the diaphragm and the control circuit described earlier with reference to the first example may be used to maintain YBCO near 77K. As for the insulating material used to form the tunnel junction, silicon oxide or aluminum oxide may be used.

If a plurality of diaphragms each including the above functional material are disposed in the manner shown in FIG. 8, it is possible to achieve multidimensional detection or other calculating, controlling, and processing operations in a sophisticated fashion.

Furthermore, by forming a circuit using a superconductive material on the diaphragm as shown in FIG. 9, it is possible to achieve ultra-low noise detection, amplification, and calculation of a signal at an ultra high speed. This is because the interconnection wires formed of the superconductive material has no resistance, and thus Johnson noise is completely eliminated, and no propagation delay along the interconnection wires occur, which would otherwise occur due to parasitic capacitance and resistance associated with the interconnection wires.

(Eight example)

Figure 15:
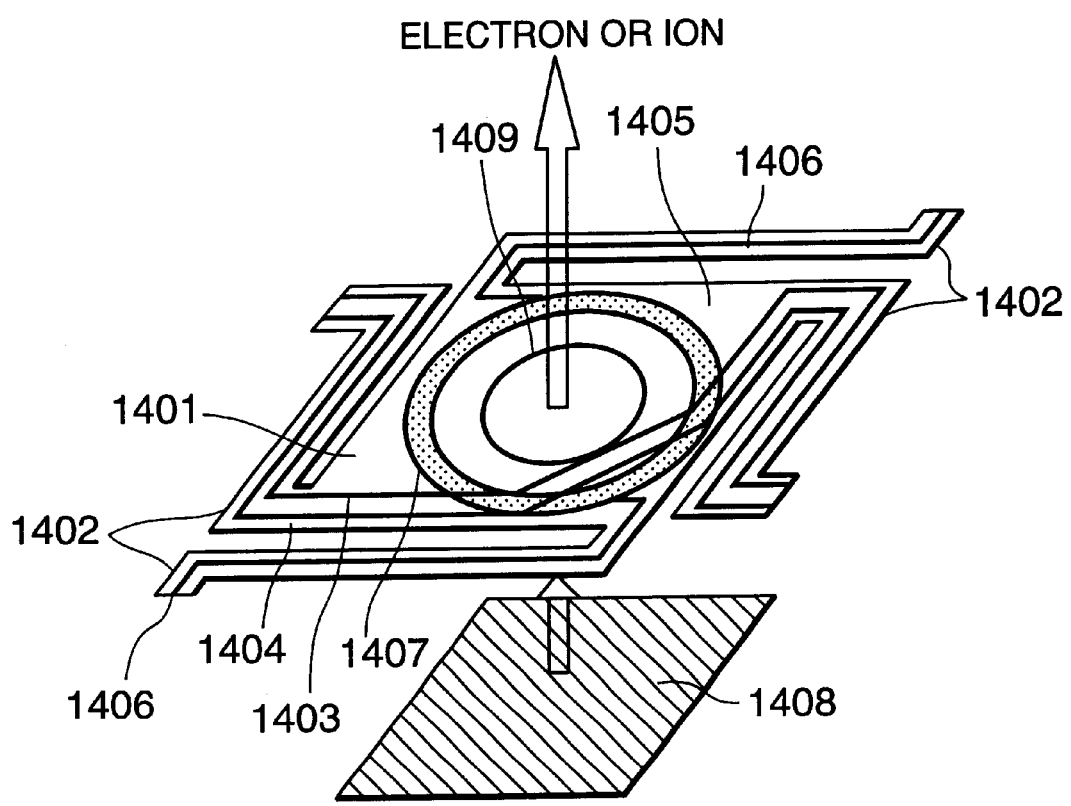
FIG. 15 is a schematic diagram illustrating an eighth example of an electronic device according to the present invention;.

FIG. 15 illustrates an example in which a superconductive wire 1407 in the form of a loop is disposed on a diaphragm cooled to a low temperature, and a current is passed though the loop of superconductive wire 1407 so as to generate a very large magnetic field.

The generated magnetic field may be used to form a micro motor or a micro actuator such as a manipulator. The magnetic field may also be used to deflect electrons. That is, if this device for generating a magnetic field is combined with a flat-plane electron source such as a cold cathode or an ion source, it is possible to realize a small-sized electron microscope or accelerator.

Various functions described above may be combined together into a device. Conversely, a similar device may be realized using a material which is different from those described above but which has an effect similar to those described above.

As described above, the present invention provides an electronic device which includes a functional device formed on a thermally isolated element. The electronic device according to the present invention has the advantages of the small size, light weight, low power consumption, high operation speed, and high accuracy.

What is claimed is:

1. An electronic device, comprising:
   a substrate;
   a functional device which is operated at a desired temperature;
   a thermally isolated diaphragm formed above the substrate, said thermally isolated diaphragm including a device portion which is isolated from the substrate by a cavity; and
   a electrical-to-thermal transducer formed in said thermally isolated diaphragm for converting an electrical signal to heat;
   at least a part of the functional device being in thermal contact with the device portion of the thermally isolated diaphragm.

2. An electronic device as claimed in claim 1, wherein:
   the temperature of the functional device is controlled by the electrical-to-thermal transducer.

3. An electronic device as claimed in claim 1, wherein:
   the functional device comprises a device which realizes a function by cooling.

4. An electronic device as claimed in claim 3, wherein:
   the device has a superconductive effect.

5. An electronic device as claimed in claim 1, wherein:
   the functional device comprises a device which enhance performance by cooling.

6. An electronic device as claimed in claim 5, wherein:
   the device is a semiconductor device.

7. An electronic device as claimed in claim 6, wherein:
   the semiconductor device has carrier mobility, and
   the carrier mobility is increased when the semiconductor device is cooled.

8. An electronic device as claimed in claim 6, wherein:
   the semiconductor device has interface state, and
   the interface state is reduced when the semiconductor device is cooled.

9. An electronic device as claimed in claim 6, wherein:
   the semiconductor device is at least one selected from the group consisting of a semiconductor laser and a semiconductor integrated circuit.

10. An electronic device as claimed in claim 1, wherein:
    the functional device comprises a device which enhances performance by heating.

11. An electronic device as claimed in claim 10, wherein:
    the device has a ferroelectric property.

12. An electronic device as claimed in claim 11, wherein:
    the device is operated near a Curie temperature.

13. An electronic device as claimed in claim 1, wherein:
    the functional device comprises a device which realizes the function by quickly changing the temperature.

14. An electronic device as claimed in claim 13, wherein:
    the device is a variable wavelength laser.

15. An electronic device as claimed in claim 1, wherein:
    the functional device is formed on the device portion.

16. An electronic device as claimed in claim 15, wherein:
    the device portion has a thickness equal to or less than 10 $\mu$m.

17. An electronic device as claimed in claim 15, wherein:
    the thermally isolated diaphragm has a leg for supporting the device portion, and the leg serves to electrically connect the device portion to the substrate.

18. An electronic device as claimed in claim 1, wherein:
    the electrical-to-thermal transducer comprises a thin film-shaped Peltier device.

19. An electronic device as claimed in claim 18, wherein:
    the thin film-shaped Peltier device contains silicon a main component.

20. An electronic device as claimed in claim 1, further comprising:

a circuit which is provided in said substrate and which supplies an electrical signal to the electrical-to-thermal element.

21. An electronic device as claimed in claim 1, wherein:

the electronic device includes a plurality of the thermally isolated diaphragms and a plurality of electrical-to-thermal transducers formed in the thermally isolated diaphragms, and the temperature of each thermally isolated diaphragm can be set to an arbitrary value.

22. An electronic device as claimed in claim 1, further comprising:

a thermal-to-electrical transducer formed in said thermally isolated diaphragm for converting heat to an electrical signal.

23. An electronic device as claimed in claim 22, further comprising:

control means for controlling the electrical-to-thermal transducer in accordance with signal from the thermal-to-electrical transducer.

24. An electronic device as claimed in claim 23, wherein:

the control means comprises a control circuit arranged in the substrate.

* * * * *